United States Patent [19]
Giorgetta

[11] Patent Number: 5,252,928
[45] Date of Patent: Oct. 12, 1993

[54] CHARGE AMPLIFIER CIRCUIT

[75] Inventor: Mario Giorgetta, Winterthur, Switzerland

[73] Assignee: Kistler Instrumente AG, Winterthur, Switzerland

[21] Appl. No.: 853,820

[22] Filed: Mar. 19, 1992

[30] Foreign Application Priority Data

Apr. 2, 1991 [CH] Switzerland .................. 00969/91

[51] Int. Cl.$^5$ ............................................. H03F 1/14
[52] U.S. Cl. ........................................ 330/51; 330/85
[58] Field of Search ............... 328/151; 330/9, 51, 330/207 P, 298, 109, 110, 294, 85

[56] References Cited

U.S. PATENT DOCUMENTS

| | | | |
|---|---|---|---|
| 3,582,675 | 6/1971 | Jordan et al. ................. | 330/85 X |
| 3,588,729 | 6/1971 | Satterfield .................... | 330/207 P |
| 3,758,872 | 9/1973 | Diddens ....................... | 330/51 X |
| 4,218,662 | 8/1980 | Schröder ..................... | 330/51 X |

*Primary Examiner*—Steven Mottola
*Attorney, Agent, or Firm*—Barnes & Thornburg

[57] ABSTRACT

The invention relates to a charge amplifier circuit with a control loop for resetting, which for minimizing the leakage currents that falsify the measuring results includes two diodes ($D_1$) and ($D_2$), connected antiparallel in the loop and constituting input protection diodes of an integrated circuit (ISK). In the operating (measuring) phase the diode resistance ($R_D$) is extremely high and the voltage drop over the diode pair is small, so that no significant leakage current gets through onto the charge amplifier input $IN_Q$. In the reset phase the diode resistance ($R_{Dr}$) is practically nil.

14 Claims, 4 Drawing Sheets

CHARGE AMPLIFIER CIRCUIT

The invention relates to a charge amplifier circuit with a control loop for resetting, consisting of an operational amplifier, a switch and diodes.

Charge amplifier circuits as used for example in conjunction with piezoelectric transducers suffer from the disadvantage that the output reference point wanders on the charge amplifier. This wandering is termed drift. With quasistatic measurements drift may falsify the results considerably. A principal cause of drift are the leakage currents at the amplifier input. Where a semiconductor switch is used to reset the charge amplifier, the leakage currents originate from this switching device for the most part. The purpose of the present invention is to reduce these leakage currents so that they become insignificant for the most demanding quasistatic measurements occurring in practice.

The task is performed by making the diodes used in the control loop for resetting into input protection diodes of an integrated circuit.

Below the individual steps which led to the invention are set out and described in detail with the help of drawings.

Figure 1:
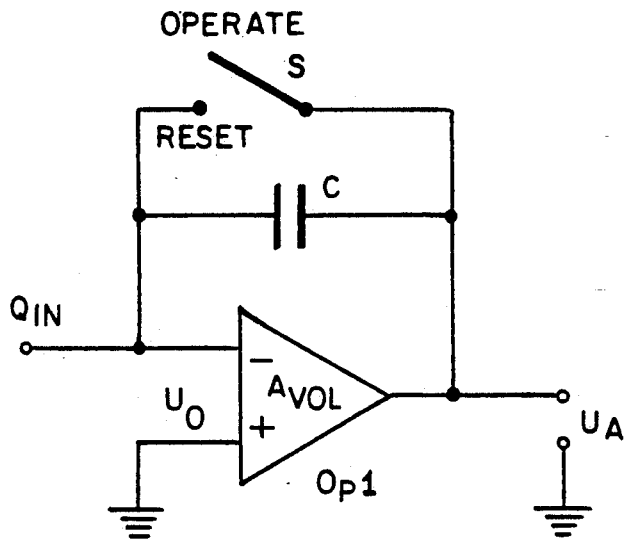
FIG. 1 shows a conventional charge amplifier circuit.

FIG. 1 represents the conventional charge amplifier circuit. A piezoelectric force transducer for example gives under load an electrical charge $Q_{IN}$ proportional to the force to the—input of the operational amplifier Op, whose +input is grounded and whose input offset voltage amounts to $U_o$. With an ideal operational amplifier, no current flows into the amplifier input and the internal gain $A_{VOL}$ is almost infinite, so that during measurement (with switch S open in the operating position) the charge $Q_{IN}$ flows onto the negative feedback capacitance C. In this way a voltage $U_A$ occurs at the amplifier output in accordance with the formula:

$$U_A = \frac{IN}{C} + U_o \text{ (operate)}$$

With an ideal charge amplifier the output voltage $U_A$ is thus directly proportional to the charge $Q_{IN}$ delivered by the transducer, and hence also proportional to the measurand (e.g. force). When switch S closes (reset position) the capacitance $C = \infty$ is to be set. Accordingly $$U_A = U_o$$

i.e. the starting point for a new measurement by opening switch S again is once more $U_o$.

Figure 2:
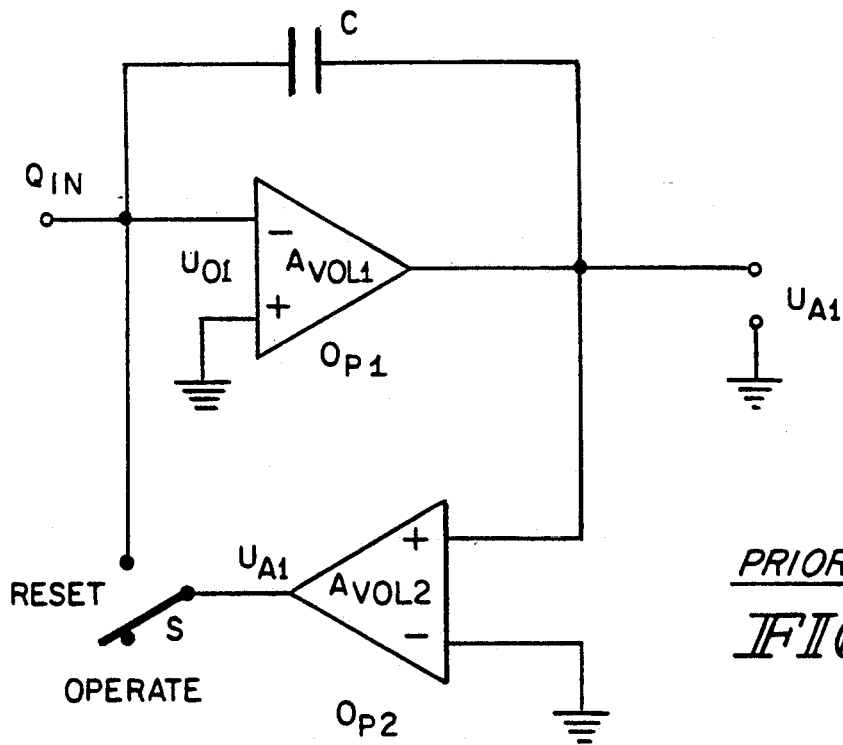
FIG. 2 shows a charge amplifier circuit with a control loop for resetting.

With real charge amplifiers there are leakage currents, which flow into the negative feedback capacitance C, falsifying $U_A$ and with it the measuring result. The switch S must be highly insulating, and is generally a very bulky reed relay. FIG. 2 shows a charge amplifier circuit with a control loop for resetting. In principle this circuit is covered by British Patent GB 1 330 497 and has thus been state of the art since 1973. The following embodiments are all based on the embodiment shown in FIG. 2. With switch S opened (operating position) the circuitry in FIG. 2 functions exactly like that in FIG. 1, because the control loop for resetting is interrupted, i.e. a charge $Q_{IN}$ resulting from a piezoelectric effect for example flows onto the negative feedback capacitance C where it sets up a voltage $(-Q_{IN}/C)$. After opening the switch S the output voltage $U_{A1}$ is $$U_{A1} = \frac{-Q_{IN}}{C} + U_{o2} \text{ (operate)}$$

As with the circuit in FIG. 1, this means that the output voltage is directly proportional to the charge $Q_{IN}$ delivered by the transducer, and is therefore proportional to the measurand (force) also.

When resetting, the charge in the negative feedback capacitance C now flows off via the now closed switch S, and the voltage on the capacitance C becomes zero, so that $$U_{A1} = U_{O2} \text{ (reset)}.$$

From this reference point a further measurement is started by opening the switch S (operating position). Obviously with this circuit too the switch S must be highly insulating in the opened state, to prevent leakage currents passing to the charge input $IN_Q$ in the measuring phase (operating, switch S open), falsifying the output voltage $U_{A1}$ and with it the measuring result. In FIG. 2, $U_{o1}$ again denotes the input offset voltage of the operational amplifier Op1, while $U_{A2}$ is the output voltage from operational amplifier Op2 and $A_{VOL1}$ and $A_{VOL2}$ are the very high open loop gains of operational amplifiers Op1 and Op2.

Figure 3:
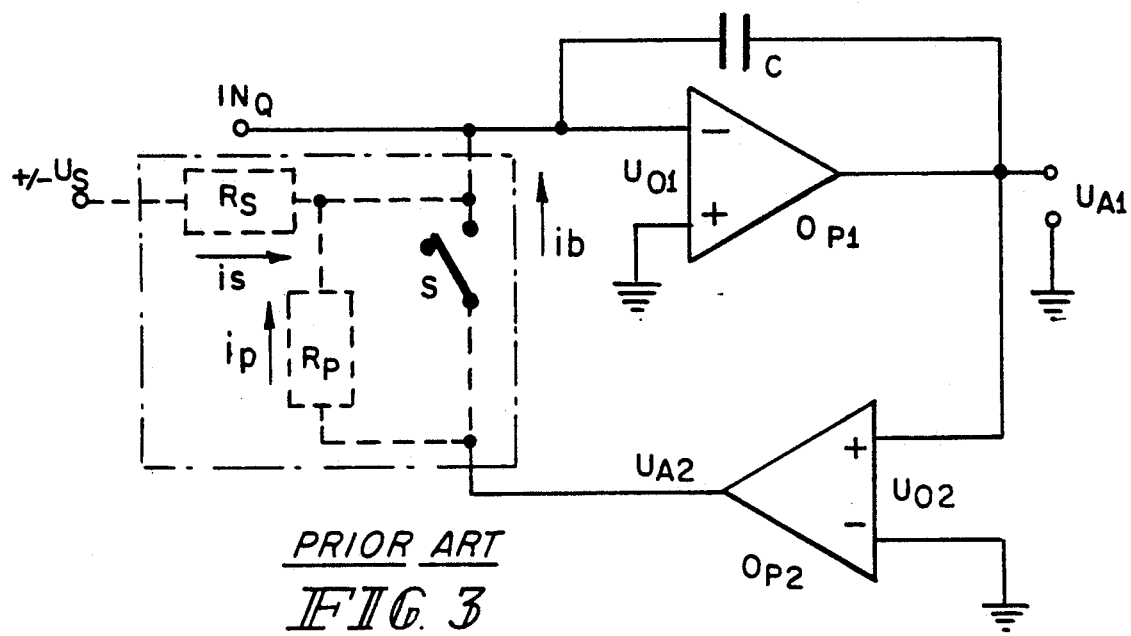
FIG. 3 shows the cause of the input leakage currents in a charge amplifier circuit with control loop analogous to FIG. 2 and electrically controlled switch.

FIG. 3 shows a charge amplifier circuit with electrically controlled switching device. The designations used have the same meanings as in the previous figures. The electrically controlled switch (represented by the dot-dashed rectangle) may be a semiconductor switch for example. The supply voltage of the switching device is designated $U_s$. From the supply a leakage current $i_s$ passes via the insulating resistance $R_s$ to the charge input $IN_Q$ of the charge amplifier. Another leakage current $i_p$ flows via the insulating resistance $R_p$ of the open switch S (in the operating state). The two currents add up to the total leakage current $i_b$. They are calculated according to the formula:

$$i_b = i_s + i_p = \frac{U_s - U_{o1}}{R_s} + \frac{U_{A2} - U_{o1}}{R_p} \text{ (operate)}$$

During measurement (operating state, switch S open) the total leakage current flows onto the charge input $IN_Q$ and falsifies the measurement, as already explained.

The voltage change of $U_{A1}$ per time unit caused by this phenomenon is $$\frac{\Delta U_{A1}}{\Delta t} = \frac{i_b}{C}$$

EXAMPLE

With a capacitance C of 100 pF and a leakage current of $10^{-11}$ A (a case quite possible in practice), according to the above formula there will be a drift of 100 mV/sec, which with a full-scale output signal $U_A$ of 10 V would mean a drift amounting to 1% of full-scale output per second. This is far too high for demanding measurements.

In the reasoning thus far the leakage currents caused by a semiconductor switch on the input of the charge amplifier, resonsible for drift during the measurement and thus falsifying the measuring signal, have played a dominant role. Accordingly in FIGS. 4 and 5 the consequence of leakage currents in a charge amplifier circuit is shown schematically in simplified form once more.

Figure 4:
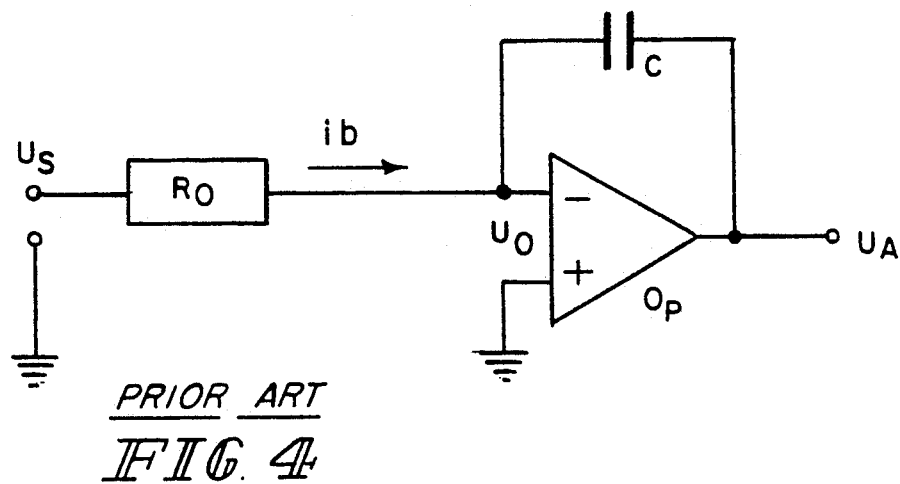
FIG. 4 shows an explanatory circuit diagram to FIG. 3.

In FIG. 4 the—input of the operational amplifier $O_p$ is under a voltage of $U_o$ referenced to ground, on a resistance $R_o$. For this purpose $U_o$ may be assumed as virtually equal to 0. Accordingly a constant current $$i_b = \frac{U_e}{R_o}$$

flows onto the—input, which over the negative feedback capacitance C sets up a constant voltage change at output $U_A$ at the same time according to $$\frac{\Delta U_A}{\Delta t} = \frac{-i_b}{C}.$$

Figure 5:
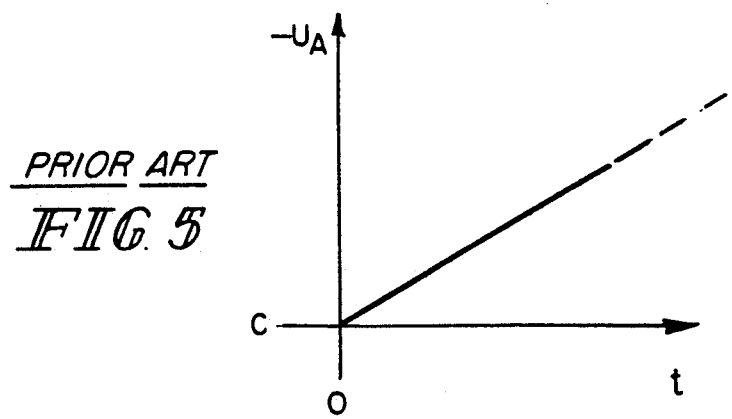
FIG. 5 shows an output voltage vs. time diagram for the circuit in FIG. 4.

The change of $U_A$ versus time is shown in FIG. 5. It is zero at the moment of switching-on the voltage source $U_e$ (t=0 in the figure) and then proceeds linearly owing to the constancy of the current $i_b$ flowing onto the capacitance C. In this way the drift of the output voltage $U_A$ in the circuit of FIG. 3 takes place also.

Figure 6:
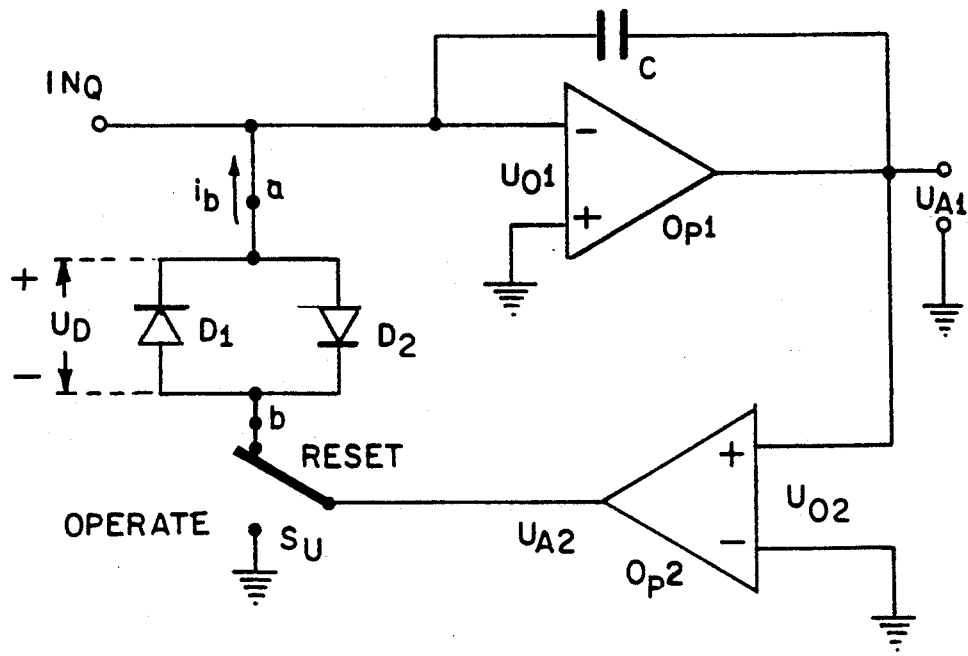
FIG. 6 shows a charge amplifier circuit with a control loop for resetting analogous to FIG. 2 but supplemented with diodes between switch and charge amplifier input.
Figure 7:
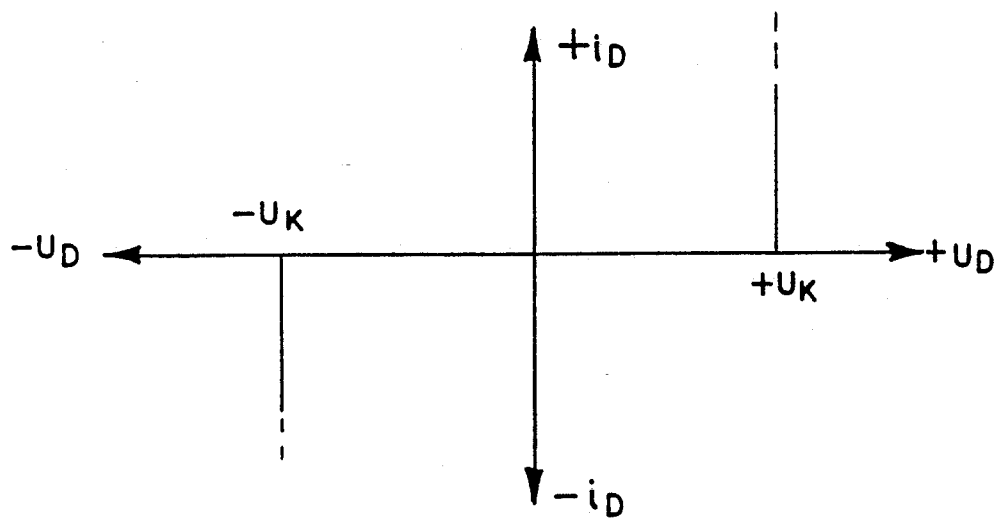
FIG. 7 shows the current-voltage characteristic of the diode circuit shown in FIG. 6.

One possible way of preventing this drift is shown in FIG. 6. There is a charge amplifier with resetting control loop, which includes diodes between the switch (e.g. semiconductor switch) and input $IN_Q$ of the charge amplifier. The two diodes $D_1$ and $D_2$ are connected antiparallel. The points 'a' and 'b' are reference points for FIG. 8. The function of these diodes is explained by FIG. 7, which plots the current $i_D$ through the diode pair as a function of the diode voltage $U_D$. Ideally the characteristic between the two knee voltages $-U_K$ and $+U_K$ is virtually horizontal, i.e. the current $i_D$ through the diodes is very low, their resistance $R_D$ very high.

$$R_{Do} = \frac{U_D}{i_D} \rightarrow \text{very high between } -U_K \text{ and } +U_K$$
(Operating. $R_{Do}$ = resistance during operating phase)

$$R_{Dr} = \frac{\Delta U_D}{\Delta i_D} \rightarrow \sim 0 \text{ for } U_D \text{ at } -U_K \text{ and } +U_K$$
(Reset. $R_{Dr}$ = resistance during reset phase)

This is put to use by placing point 'b' of the diodes at the same potential as the + input of the operational amplifier $Op_1$ (here grounded) in switch position $S_U$ (operating). This then gives $$U_D = U_{o1} << |U_K|; R_{Do} \rightarrow \text{very high}$$

$$i_b = \frac{U_{o1}}{R_{Do}} \rightarrow \text{very low}$$

In the reset phase (switch $S_U$ connects point 'b' with $U_{A2}$) the diode voltage $|U_D|$ is always at $|U_K|$ owing to the operational amplifier Op being fully driven, so that its resistance $R_{Dr}$ is practically nil.

The ideal case has been shown. In practice of course the diode characteristic does not run exactly horizontal between the knee voltages but slopes slightly, passing through the zero like an ohmic resistance. Thus the resistance is not infinite, and a leakage current can still get to the charge input $IN_Q$ and falsify the measuring result. The foregoing remarks make clear in what direction improvements are to be sought in the present diode circuit, i.e.

$$i_b = \frac{U_{o1}}{R_{Do}} \rightarrow 0, R_{Do} \rightarrow \infty \text{ (operate)}$$

Figure 8:
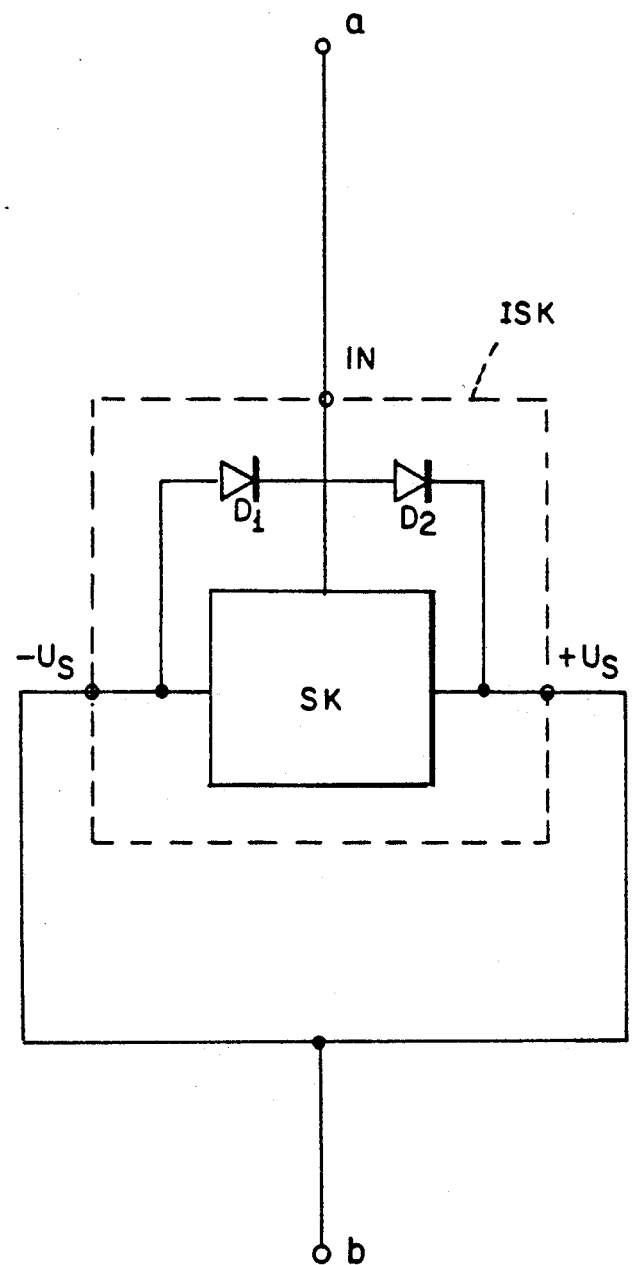
FIG. 8 shows the diode part according to the invention of the charge amplifier circuit in FIG. 6, using input protection diodes of an integrated circuit.

This means that solutions with very high $R_{Do}$ are to be sought, i.e. with a characteristic as horizontal as possible between the knee voltages. A solution of this kind has been found, and is shown in FIG. 8. FIG. 8 shows the diode part of the circuit graphed in FIG. 7, with special diodes which satisfy the requirements set out above. According to the invention the diodes employed are input protection diodes of an integrated circuit. Such diodes serve to protect the inputs of delicate circuits against overvoltages, as occur due to electrostatic discharges for example, and they do not have to meet the usual requirements for diodes in general, like high reverse bias or high current load capacity.

Shown with broken lines is the integrated circuit ISK, which contains the diode pair $D_1$ and $D_2$ integrated. Of the integrated circuit only the three inputs IN and the supply connections $-U_s$ and $+U_s$ are used. The input IN is connected with the charge amplifier $IN_Q$ through the point 'a', while the supply connections $-U_s$ and $+U_s$ are led together and connected through point 'b' with the switch $S_U$ (FIG. 6). The analogy with the diode part of the circuit in FIG. 6 is evident.

When a semiconductor switch is used for $S_U$ in FIG. 6, during the operating phase the leakage currents no longer pass onto the charge amplifier input $IN_Q$ but are led off to ground in accordance with FIG. 3.

The input protection diodes may be biased electrically in the blocking direction.

I claim:
1. A charge amplifier integrated circuit comprising:
   an operational amplifier having a feedback capacitor connected between an input and output of said operational amplifier;
   a pair of diodes connected to said input of said operational amplifier; and
   a reset switch means connected in series with said pair of diodes between said input and output of said operational amplifier for forming a resetting feedback through said pair of diodes for resetting said operational amplifier when activated.
2. A charge amplifier according to claim 1 wherein said diodes are connected in antiparallel between said input of said operational amplifier and said switch means.

3. A charge amplifier according to claim 1 wherein said switch means is a semiconductor switch.

4. A charge amplifier integrated circuit having a control loop for resetting said charge amplifier, said control loop comprising:
an operational amplifier, one or more diodes and a reset switch connected in series between an input and output of said charge amplifier for resetting said charge amplifier when said switch is activated; and
said diodes having the substantially leakage free characteristic of input protection diodes of an integrated circuit.

5. A charge amplifier according to claim 4 wherein said diodes have a breakdown voltage high enough to block current during the normal operation of said charge amplifier and to conduct current during resetting of said charge amplifier.

6. A charge amplifier according to claim 4 wherein said switch disconnects said diodes from said operational amplifier and connects said diodes to a potential to block current during normal operation of said charge amplifier; and said switch connects said diodes to said operational amplifier to conduct current during resetting of said charge amplifier.

7. A charge amplifier according to claim 4 wherein said diodes are connected in antiparallel.

8. A charge amplifier according to claim 1 including a resetting operational amplifier connected in series with said diodes and said switch means.

9. A charge amplifier according to claim 1 wherein said diodes have a breakdown voltage high enough to block current during the normal operation of said charge amplifier and to conduct current during resetting of said operational amplifier.

10. A charge amplifier according to claim 1 wherein said diodes have the substantially leakage free characteristic of input protection diodes of an integrated circuit.

11. A charge amplifier according to claim 1 wherein said diodes are input protection diodes of said integrated circuit.

12. A charge amplifier according to claim 4 wherein said diodes are input protection diodes of said integrated circuit.

13. Charge amplifier circuit according to claim 4, characterized by the diodes being electrically biased in the blocking direction.

14. Charge amplifier circuit according to claim 4, characterized by the switch being an electrically controlled semiconductor switch.

* * * * *